United States Patent [19]

Vogel et al.

[11] 4,134,066

[45] Jan. 9, 1979

[54] WAFER INDEXING SYSTEM USING A GRID PATTERN AND CODING AND ORIENTATION MARKS IN EACH GRID CELL

[75] Inventors: Marcel J. Vogel, San Jose; Siegfried F. Vogel, Los Gatos, both of Calif.

[73] Assignee: International Business Machines Corporation, New York, N.Y.

[21] Appl. No.: 780,877

[22] Filed: Mar. 24, 1977

[51] Int. Cl.² ............................................. G01R 33/00
[52] U.S. Cl. .................................. 324/210; 96/27 R; 29/574; 365/1
[58] Field of Search ............. 324/34 R, 210; 96/27 R, 96/36.2, 38.2; 29/574, 578, 579; 340/173 BB, 149 A; 156/657, 662

[56] References Cited

U.S. PATENT DOCUMENTS

| 3,259,037 | 7/1966 | Wilkinson, Jr. ...................... 96/27 R |
| 3,607,347 | 9/1971 | Sprague ................................. 96/36.2 |
| 3,742,229 | 6/1973 | Smith et al. ........................... 96/36.2 |
| 3,863,764 | 2/1975 | Myslinski et al. ................... 324/34 R |
| 3,998,639 | 12/1976 | Feldman et al. ...................... 96/36.2 |

FOREIGN PATENT DOCUMENTS 2226149  5/1973  Fed. Rep. of Germany ............. 29/578

OTHER PUBLICATIONS

Fahrni et al., Wafer Identification, IBM Tech. Bull., vol. 14, No. 4, Sep. 1971, pp. 1030-1031.

*Primary Examiner*—Robert J. Corcoran
*Attorney, Agent, or Firm*—Joseph E. Kieninger

[57] ABSTRACT

A wafer indexing and mapping system is useful for precisely locating artifacts, defects, and fabricated structural components on a wafer. A permanent micrometer grid pattern is applied to the backside of the wafer, for example, a transparent bubble wafer. The grid pattern forms an array of uniform size cells, for example, 40 unit cells wide by 40 unit cells long. Each unit cell is divided into smaller units on each side. Each cell contains a coding or indexing system to identify the row and column of the cell in the grid pattern. The grid pattern contains orientation bars which identify orientation with respect to particular wafer reference lines. The simultaneous viewing of the wafer and the grid pattern permits an accurate permanent mapping of the artifacts, defects, and fabricated structural components on the wafer, as well as on the individual small chips formed by dicing the wafer.

8 Claims, 4 Drawing Figures

WAFER INDEXING SYSTEM USING A GRID PATTERN AND CODING AND ORIENTATION MARKS IN EACH GRID CELL

FIELD OF THE INVENTION

This invention relates to wafer processing, and more particularly to a permanent mapping and indexing system for a wafer.

BRIEF DESCRIPTION OF THE PRIOR ART

By definition, an artifact is a local topographical, structural or magnetic inhomogeneity which affects the properties of the wafer. The inhomogeneity may be caused by a variation in the composition of the material, an absence of material, embedded foreign material or surface debris. A defect is any artifact that interferes with the normal operation of a device. For example, if any artifact was located in the path of a bubble domain, and if it would cause the bubble domain to behave erratically, this artifact would be classed as a defect in this system. By experience, it has been determined that certain artifacts such as etch pits, mesas, and polishing scratches are defects in a bubble device. Because of this, wafer substrates that are to be used for bubble domain devices are screened so that the total number of defects per a given area on the wafer does not exceed a certain level, for example, 5 or less defects/cm$^2$. This is a statistical guideline to insure a high yield of the finished bubble devices.

The conventional method of determining the number of defects in an epitaxially grown film of magnetic garnet material on a wafer is done by electronic means. The method involves moving the wafer through a gradient field formed by 2 pair of permanent magents. The gradient field creates an array of parallel stripe domains in the film. As the film is moved through the gradient field, the movement of the striped domains is affected by any defects or artifacts that are present on the film. The defects pin or hang up the domains during the scanning operation. The number of domains hung up are then counted electronically. This method yields a statistical count as to the total number of defects on the wafer. This method, however, does not locate the particular site on the wafer of any of the individual defects. Furthermore, there is no means of identifying which particular chips of the wafer contain the defects after the wafer is diced. In addition, this method does not distinguish between a defect that is within the film from an artifact due to particulate contamination that is on top of the film. Another difficulty with using an electronic method of this type to determine defects is that the count of defects is determined by the sensitivity setting of the equipment.

Grids prepared on microscope slides have been used in the past for locating defects having a size greater than 10 microns. These portable grids have been classed as field finders. They have, however, not been used successfully for the mapping of small defects of the size of 1 to 10 microns which present problems in bubble devices. Another primary reason why these portable grids are not suitable for work with magnetic bubble films is that microscopes with magnetic field coils surrounding the wafer or chip usually do not lend themselves to providing space for the portable grids. In addition, reaccessing the wafer on the grid subsequently after additional processing has been done cannot be done precisely enough to relocate previously observed defects of this small size.

SUMMARY OF THE INVENTION

It is a primary object of this invention to provide a wafer with an indexing and mapping system.

It is another primary object of this invention to provide a system for accurately locating artifacts and defects on a wafer.

It is another object of this invention to permanently locate an artifact on a wafer for subsequent analysis to determine whether it is a defect.

It is still another object of this invention to permanently locate structural components on a wafer.

It is yet still another object of this invention to retain the identity of a chip on a wafer regardless of the orientation of the wafer.

It is a further object of this invention to retain the identity of a particular chip in the wafer after the wafer has been diced.

It is another further object of this invention to have a coding system built into the chip suitable for use before or after the wafer has been diced.

It is still another further object of this invention to provide an indexing system that could be used to control the process automation of chips.

It is yet still another further object of this invention to provide a means for determining the size of artifacts, device line widths and device gap widths.

These and other objects are accomplished by applying a permanent micrometer grid pattern to the backside of the wafer, for example, a transparent bubble wafer. In a preferred embodiment, the grid pattern is photolithographically produced by chemical or sputter etching onto the backside of the wafer. An alternative method is to deposit a thin film of platinum or another noble metal and etch the grid pattern in the metal. In a preferred embodiment, the grid pattern consists of an array of a plurality of uniform size cells, for example, 40 unit cells wide by 40 unit cells long. Each unit cell is 1 millimeter square and has each side divided into ten units. Each unit cell includes a coding system, for example, a digital coding arrangement to identify the row and column of each cell in the grid pattern. The grid pattern has orientation lines or bars to align the grid pattern with respect to the wafer flats. The simultaneous viewing of the wafer and the grid pattern permits an accurate permanent mapping of the artifacts, defects, and structural components on the wafer, as well as on the small individual chips formed by dicing the wafer.

Other objects of this invention will be apparent from the following detailed description, reference being made to the accompanying drawings wherein specific embodiment of the invention is shown.

DESCRIPTION OF THE ILLUSTRATIVE EMBODIMENT

Figure 1:
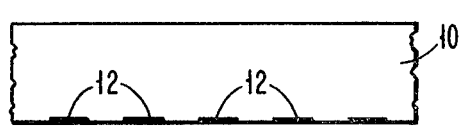
FIG. 1 is a cross-sectional view of a wafer having a grid pattern applied thereto.

In accordance with this invention, the wafer indexing and mapping system consists of a wafer 10 as shown in FIG. 1 having permanent micrometer grid pattern 12 applied to one side of the wafer. One approach to applying the grid to the wafer is by using the conventional photolithographic process. In such a process, a photoresist layer is applied to the substrate, a mask is placed on top of the photoresist layer and the photoresist is then exposed to ultraviolet light. The pattern is developed and the wafer is then etched, either chemically or by sputtering, through the mask. An alternate approach is to deposit a thin film of platinum or another noble metal onto the substrate. A mask is then placed over the thin metal film and the grid pattern is then etched through the mask into the metal.

Figure 2:
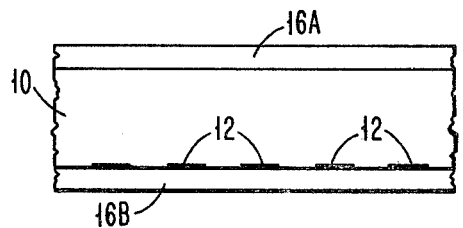
FIG. 2 is a cross-sectional view of the wafer, the grid pattern and an epitaxial film.

This invention is particularly useful for indexing and mapping wafers that are used for bubble domain devices. The wafer indexing and mapping system can be used to locate artifacts, defects, and structural components on the wafer. For bubble domain device application, the bubble wafer 10 is a transparent non-magnetic material such as gadolinium galium garnet. The wafer 10 is typically immersed in a molten solution to grow films 16A and 16B of a magnetic material capable of supporting bubble domains therein, as shown in FIG. 2. One of the films, 16B, covers the grid pattern 12. Both films 16A and 16B are suitable for use in supporting bubble devices. Typically, however, the bubble device is only positioned on one side of the device, for example, on film 16A. While the grid pattern 12 may be positioned between substrate 10 and either film 16A or 16B in bubble devices, the preferred position of grid pattern 12 is to be located on the side away from where the bubble device will be. In FIG. 2, for example, the preferred position of the bubble device will be in film 16A. In other applications, for example, in the silicon semi-conductor device technology, it may be desirable to have the grid pattern on the other side.

Figure 3:
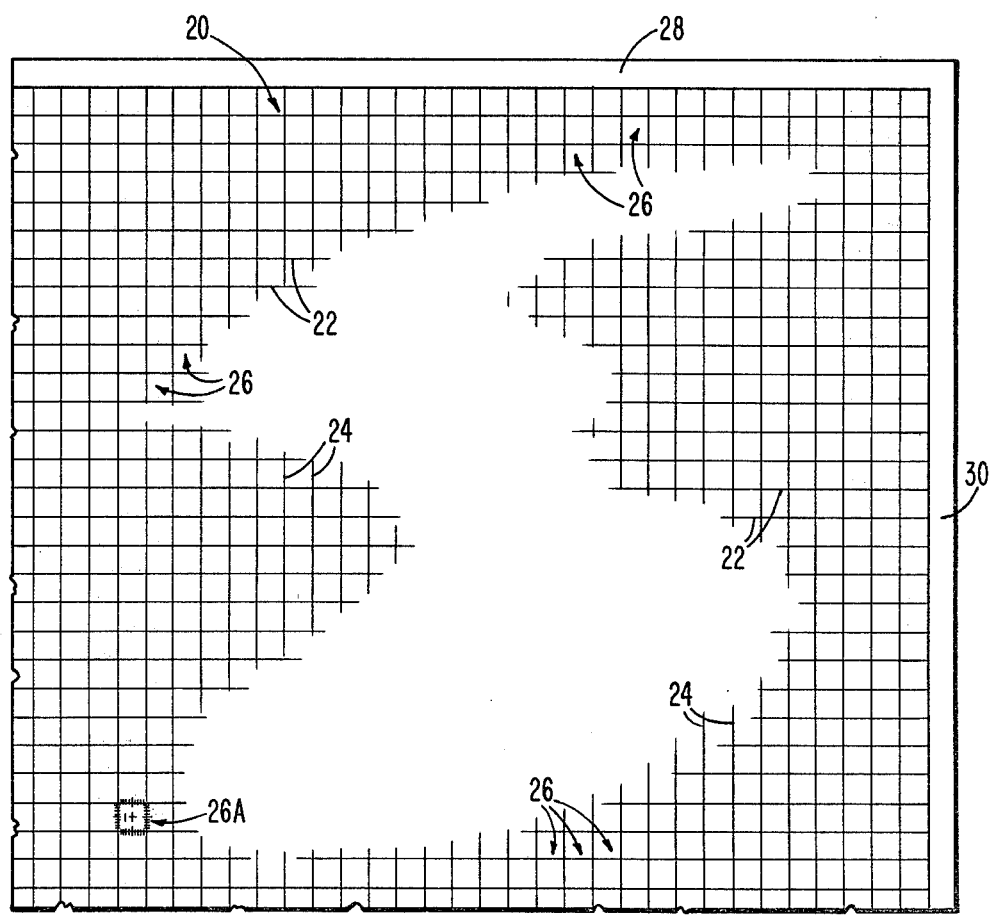
FIG. 3 is a top view of a portion of the grid pattern.

A view of a portion of the grid pattern mask 20 used to form the grid pattern is shown in FIG. 3. The grid pattern mask 20 consists of a plurality of horizontal uniformly spaced parallel lines 22 which intersect a plurality of uniformly spaced vertical lines 24 to form a plurality of unit cells 26 which have a uniform size. The grid pattern mask 20 has a horizontal orientation line or bar 28 which is parallel to horizontal lines 22. A vertical orientational line or bar 30 is parallel to vertical lines 24. When the grid pattern mask 20 is placed on the wafer (not shown), the orientation lines 28 and 30 are lined up with the wafer flats.

Figure 4:
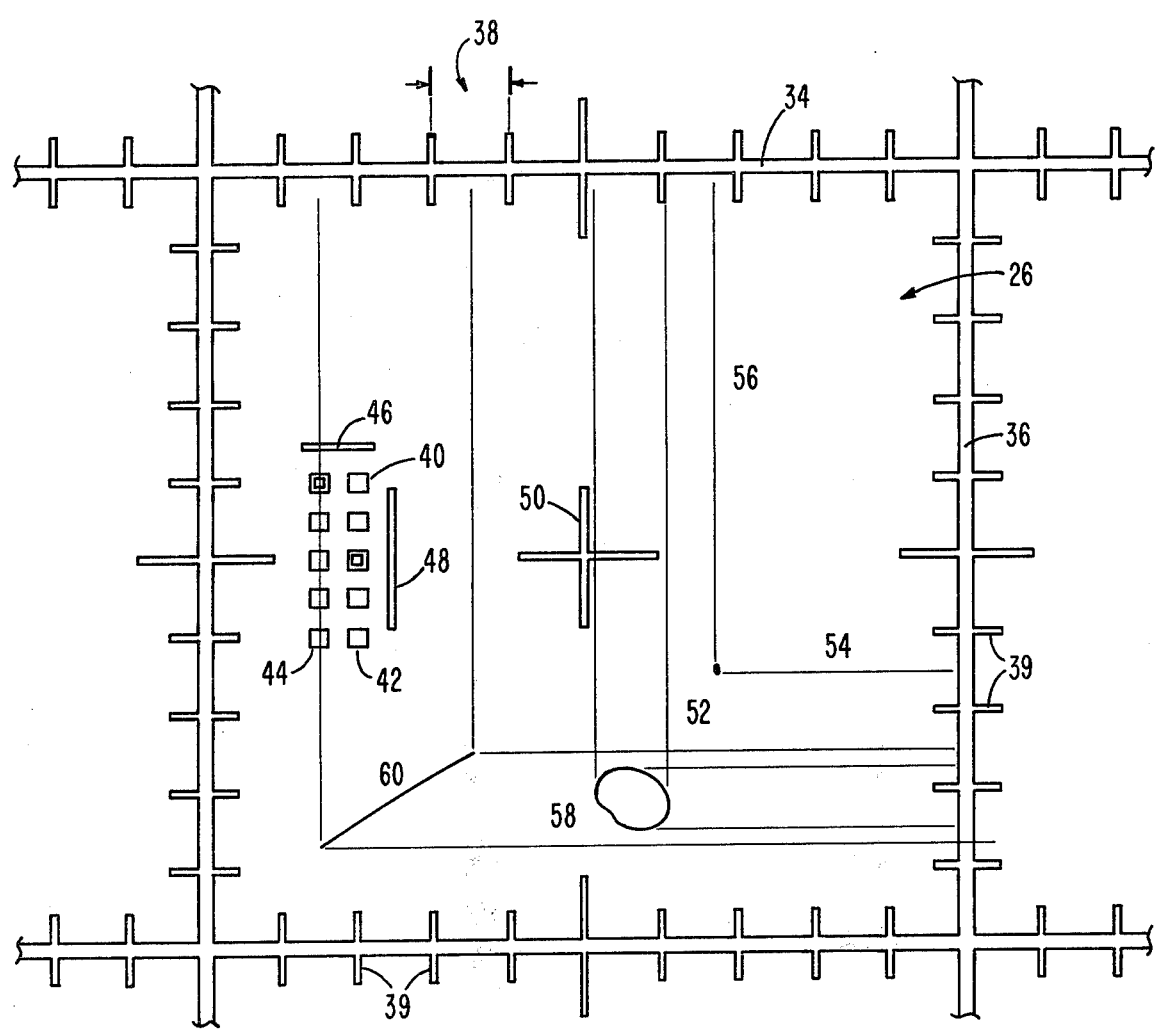
FIG. 4 is a diagram showing a unit cell.

An enlarged view of unit cell 26A is shown in FIG. 4. The unit cell 26A is of a uniform size, preferably square with sides 34 and 36 being the same size. Sides 34 and 36 are divided into ten portions 38 of preferably equal size. In a preferred embodiment, the distance 38 is 0.01 centimeters.

The cell 26A has a coding system 40. The coding system 40 identifies the particular cell and its location in the grid pattern. In a preferred embodiment, the coding system 40 consists of a column 44 of squares to form a binary code which indicates the column position of the cell 26A in the grid pattern. The counting always proceeds in this example from the top, that is, the short alignment bar 46, to the bottom. The coding system 40 also includes a column 42 of squares which is a binary code and indicates the row position of the cell 26A in the grid pattern. A square with detail is a binary zero, and a square with no detail is a binary one. Hence, the information provided in column 44 indicates the column of the cell and the information in column 42 represents the row of the cell.

In this embodiment, the cell 26A boundary lines 34 and 36 have a width of 20$\mu$m, while the short subdividing lines 39 are only 10$\mu$m wide. It is possible to reduce such a pattern optically by a factor of ten and still obtain a photolithographically useful mask with a line width of 2$\mu$m and 1$\mu$m, respectively. Such a pattern can be superimposed onto the original grid pattern in order to obtain a division of the space with a ten times higher resolution (1$\mu$m, interpolated).

FIG. 4 also shows a point artifact 52, whose location on the wafer is obtained by projecting orthogonal lines 54 and 56 to the vertical and horizontal righthand and upper cell boundaries. In this example, the location of the artifact 52 is 27.65; 30.34.

In the number 27.65, 27 stands for the row counted from the top of grid pattern of the cell that the artifact is in. The row number, in this case 27, is read in column 42 of the coding system 40. In the number 27.65, .65 stands for the vertical distance measured form the top of row 27. The last digit, in this case 5, is obtained by interpolation.

In the number 30.34, 30 stands for the column counted from the right hand side of the grid pattern of the cell the artifact is in. The column number, in this case 30, is read in column 44 of the coding system 40. In the number 30.34, .34 stands for the horizontal distance measured from the right hand side of column 30. In the preferred embodiment of the invention, the two coordinates indicate the distances in millimeters of the artifact from the two reference flats on the wafer edge.

Artifact 58, a large area of disturbance, is indexed by two coordinates each on the two axes, for example, 27.77–27.85; 30.39–30.48. The difference of two corresponding coordinates indicates the extent of the artifact in the two dimensions in millimeters.

Similarly, the scratch 60 is indexed by the coordinates of its two end points (27.74–27.87; 30.64–30.85) and the length in millimeters of the scratch can be calculated from this data.

The two short bars 46 and 48 above and on the right hand side of the binary code 40 shown in FIG. 4 provide for computer registration of cells with subsequent reading and interpretation of the binary code. An alternate method is to utilize the grid micrometer lines and detent by command to the appropriate position. These features thus allow automatic testing for defects and registration of defects or artifacts by location, size, etc.

The cell 26A contains an alignment line or bar 46 for the horizontal or row direction and another alignment line or bar 48 for the vertical or column direction.

In a preferred embodiment, the cell 26A contains a crossline 50 which divides the cell 26A into four quadrants. In effect then, each cell 26 is sub-divided into four smaller sub-cells (not shown).

Although a preferred embodiment of this invention has been described, it is understood that numerous variations may be made in accordance with the principles of this invention.

What is claimed is:

1. A wafer assembly for providing a permanent two-dimensional wafer indexing and mapping system comprising
a wafer having a first side and a second side,
a grid pattern engraved into the surface of one side of said wafer, said grid pattern dividing said wafer into a plurality of uniform size cells,
a coding system in said cells engraved into the surface of one side of said wafer which uniquely identifies each cell and defines the exact location of each cell of said wafer, and an orientation system including at least two marks of different dimensions for alignment purposes in said cells engraved into the surface of one side of said wafer.

2. A wafer assembly as described in claim 1 wherein said cells contain a center crossline positioned to subdivide said cells into four quadrants of equal dimensions.

3. A wafer assembly as described in claim 1, wherein said orientation system includes a first mark which is parallel to a first side of said grid pattern.

4. A wafer assembly as described in claim 3 wherein said orientation system includes a second mark which is perpendicular to said first side of said grid pattern.

5. A wafer assembly for providing a permanent two-dimensional wafer indexing and mapping system comprising a wafer having a first side and a second side, a grid pattern engraved into the surface of one side of said wafer, said grid pattern dividing said wafer into a plurality of uniform size cells, a binary coding system in said cells engraved into the surface of one side of said wafer which uniquely identifies each cell and defines the exact location of each cell of said wafer, and an orientation system including at least two marks of different dimensions for alignment purposes in said cells.

6. A wafer assembly as described in claim 5 wherein said binary coding system describes the column in the grid pattern where said cell is located.

7. A wafer assembly as described in claim 5 wherein said binary coding system describes the row in the grid pattern where said cell is located.

8. A method of precisely locating defects in a wafer comprising the steps of:

engraving a permanent grid pattern which forms a plurality of uniform size cells as a integral part into one side of a water, engraving a coding system into the surface of said wafer which uniquely identifies each cell and defines the exact location of each cell of said wafer, engraving an orientation system including at least two marks of different dimensions for alignment purposes in said cells, and identifying the position of said defects in said grid pattern by utilizing said coding system and said orientation system.

* * * * *